US009370863B2

(12) United States Patent
Tsuji et al.

(10) Patent No.: US 9,370,863 B2
(45) Date of Patent: Jun. 21, 2016

(54) ANTI-SLIP END-EFFECTOR FOR TRANSPORTING WORKPIECE

(71) Applicant: ASM IP Holding B.V., Almere (NL)

(72) Inventors: Naoto Tsuji, Tokyo (JP); Takayuki Yamagishi, Kashiwazaki (JP)

(73) Assignee: ASM IP Holding B.V., Almere (NL)

( * ) Notice: Subject to any disclaimer, the term of this patent is extended or adjusted under 35 U.S.C. 154(b) by 227 days.

(21) Appl. No.: 14/172,220

(22) Filed: Feb. 4, 2014

(65) Prior Publication Data
US 2015/0217456 A1    Aug. 6, 2015

(51) Int. Cl.
| B25J 15/00 | (2006.01) |
| H01L 21/677 | (2006.01) |
| B23Q 7/00 | (2006.01) |
| H01L 21/687 | (2006.01) |

(52) U.S. Cl.
CPC ....... B25J 15/0014 (2013.01); H01L 21/67742 (2013.01); H01L 21/68707 (2013.01); *Y10T 29/49998* (2015.01)

(58) Field of Classification Search
CPC ... H01L 21/673; H01L 21/683; H01L 21/687; H01L 21/68707; H01L 21/6875; H01L 21/67306; H01L 21/67346; B25J 15/0014; B25J 11/0095; Y10T 29/49998; Y10T 29/49947; Y10S 414/139
See application file for complete search history.

(56) References Cited

U.S. PATENT DOCUMENTS

| 5,718,574 | A | * | 2/1998 | Shimazu | ............. | C23C 16/4583 269/296 |
| 6,305,898 | B1 | * | 10/2001 | Yamagishi | ........ | H01L 21/67766 414/222.01 |
| 6,435,798 | B1 | * | 8/2002 | Satoh | .................. | C23C 16/4586 118/728 |
| 6,450,757 | B1 | * | 9/2002 | Saeki | ..................... | B25J 9/1065 414/744.5 |
| 6,699,003 | B2 | * | 3/2004 | Saeki | ..................... | B25J 9/1065 414/744.5 |
| 6,990,430 | B2 | | 1/2006 | Hosek | | |
| 7,207,763 | B2 | * | 4/2007 | Lee | ................... | H01L 21/67303 156/345.3 |
| 7,865,070 | B2 | * | 1/2011 | Nakamura | ........ | H01L 21/67109 392/391 |
| 7,925,378 | B2 | | 4/2011 | Gilchrist et al. | | |
| 7,963,736 | B2 | | 6/2011 | Takizawa et al. | | |
| 8,041,450 | B2 | | 10/2011 | Takizawa et al. | | |
| 2003/0012632 | A1 | * | 1/2003 | Saeki | ..................... | B25J 9/1065 414/744.5 |
| 2003/0170583 | A1 | * | 9/2003 | Nakashima | ............. | C30B 33/00 432/241 |

(Continued)

*Primary Examiner* — Essama Omgba
(74) *Attorney, Agent, or Firm* — Snell & Wilmer LLP

(57) ABSTRACT

An anti-slip end-effector for transporting a workpiece, which is configured to be attached to a robotic arm, includes: a workpiece-supporting area for placing a workpiece thereon for transportation; at least one front protrusion disposed at a distal end of the workpiece-supporting area for engaging an edge of the workpiece to restrict movement of the workpiece placed on the workpiece-supporting area beyond the front protrusion; and at least one anti-slip protrusion disposed in the workpiece-supporting area for contacting and supporting the backside of the workpiece, said anti-slip protrusion having a top face having a static friction coefficient of 1.0 or more as measured against the backside of the workpiece, and having a surface roughness of less than 0.4 μm.

13 Claims, 7 Drawing Sheets

(56) References Cited

U.S. PATENT DOCUMENTS

| | | | |
|---|---|---|---|
| 2006/0113806 A1 | 6/2006 | Tsuji et al. | |
| 2008/0211526 A1* | 9/2008 | Shinma | G01R 31/2865 324/750.28 |
| 2008/0267598 A1* | 10/2008 | Nakamura | H01L 21/67109 392/416 |
| 2009/0045829 A1* | 2/2009 | Awazu | G01R 31/2865 324/762.05 |
| 2009/0050621 A1* | 2/2009 | Awazu | H05B 3/148 219/444.1 |
| 2009/0250955 A1* | 10/2009 | Aoki | H01L 21/68707 294/218 |
| 2010/0178137 A1 | 7/2010 | Chintalapati et al. | |
| 2011/0081519 A1* | 4/2011 | Dillingh | F16D 28/00 428/141 |
| 2012/0325148 A1 | 12/2012 | Yamagishi et al. | |
| 2013/0084156 A1* | 4/2013 | Shimamoto | B25J 9/042 414/744.5 |
| 2015/0078874 A1* | 3/2015 | Sansoni | H01L 21/68707 414/749.1 |
| 2015/0086316 A1* | 3/2015 | Greenberg | H01L 21/6838 414/752.1 |
| 2015/0170954 A1* | 6/2015 | Agarwal | H01L 21/68757 414/226.05 |

* cited by examiner

US 9,370,863 B2

ANTI-SLIP END-EFFECTOR FOR TRANSPORTING WORKPIECE

BACKGROUND OF THE INVENTION

1. Field of the Invention

The present invention generally relates to an end effector for transporting a workpiece such a semiconductor wafer between a transferring chamber and a processing chamber for processing a workpiece, for example.

2. Description of the Related Art

A process of semiconductor manufacturing includes a step of transporting a semiconductor wafer from a wafer-storing cassette to a processing chamber via a transferring chamber using a robotic arm or a step of transporting a semiconductor wafer from a processing chamber to another processing chamber using a robotic arm. The robotic arm is provided with an end effector for loading a wafer thereon and carrying the wafer from one chamber to another. Typically, the end effector does not have a mechanical clamping mechanism for clamping a wafer, and by a wafer positioning or alignment mechanism (e.g., those disclosed in U.S. Patent Application Publication No. 2012/0325148, U.S. Pat. No. 7,963,736, and U.S. Pat. No. 8,041,450, each disclosure of which is herein incorporated by reference in its entirety), a wafer is placed on the end effector for transfer. The wafer stays on the end effector while being carried by friction against a surface of the end effector, which is caused by gravity. As the throughput is increased, the transferring speed by the robotic arm is also increased. When the transferring speed is increased, since the wafer stays on the end effector by friction, the wafer sometimes moves relative to the end effector and slips out of place, thereby causing a transfer error and decreasing transfer stability. At least one embodiment of the present invention can effectively resolve the above problem.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

Some embodiments provide a transfer mechanism for transferring a workpiece, comprising: an end effector comprising a front protrusion provided at a tip end (distal end) thereof for contacting a periphery of the workpiece and restricting movement of the workpiece, which end effector further comprises at least one anti-slip protrusion protruding from a top surface thereof for contacting and supporting a backside of the workpiece; and an end effector movement mechanism for lateral motion along an X axis, front and back motion along a Y axis, vertical motion along a Z axis, and rotational motion about the Z axis, wherein the anti-slip protrusion has a static friction coefficient of 1.0 or more against a polished silicon wafer (having a surface roughness (Ra) of e.g., about 1 nm or lower).

In some embodiments, the surface roughness (Ra) of the anti-slip protrusion is less than 0.4 μm. In some embodiments, the surface roughness (Ra) of the anti-slip protrusion is less than 0.05 μm and has a static friction coefficient of 1.2 or more against a silicon wafer.

In some embodiments, the anti-slip protrusion is made of engineering plastics. In some embodiments, the anti-slip protrusion is made of polybenzimidazole or aromatic polyimide.

In some embodiments, the anti-slip protrusion is pretreated before being attached to the end effector to increase the static friction coefficient of the anti-slip protrusion by rubbing the protrusion against Si, $SiO_2$, SiN, SiC, or gallium arsenide (GaAs).

The present invention is also directed to any of the end effectors disclosed herein, a robotic arm provided with the end effector, and a method of manufacturing the end effector.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
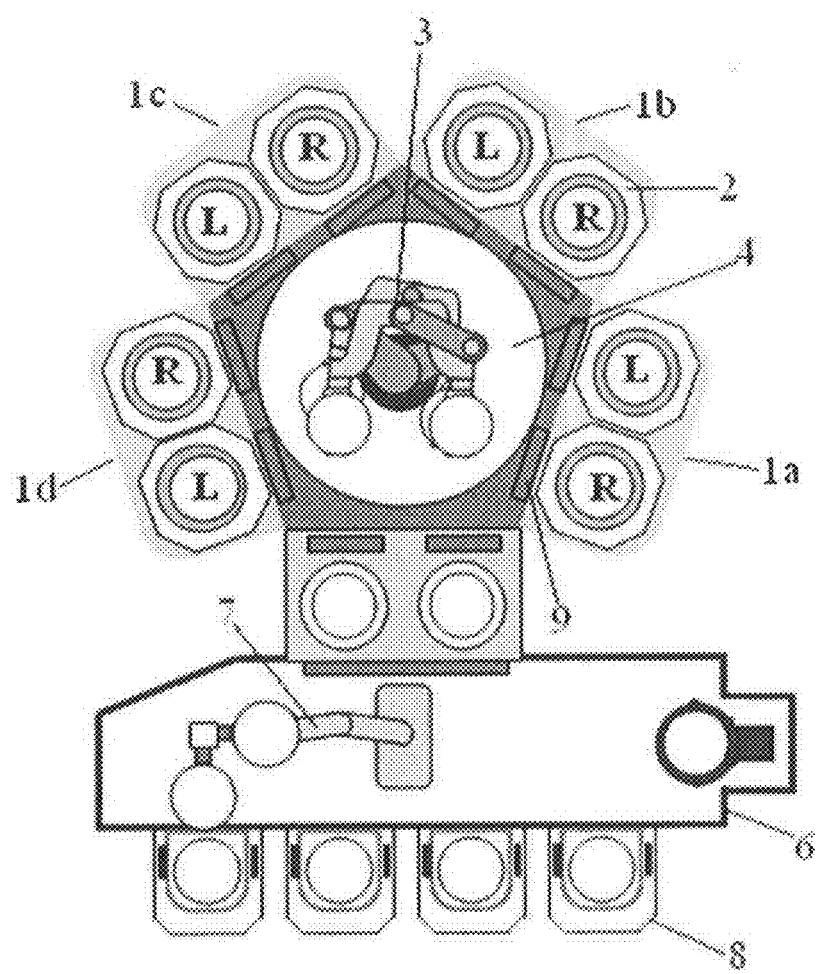
FIG. 1 is a schematic plan view of a semiconductor-processing apparatus with dual chamber modules usable in some embodiments of the present invention.

In this disclosure, an article "a" or "an" refers to a species or a genus including multiple species. Further, in this disclosure, any two numbers of a variable can constitute a workable range of the variable as the workable range can be determined based on routine work, and any ranges indicated may include or exclude the endpoints. In all of the disclosed embodiments, any element used in an embodiment can be replaced with any elements equivalent thereto, including those explicitly, necessarily, or inherently disclosed herein, for the intended purposes. Additionally, any values of variables indicated (regardless of whether they are indicated with "about" or not) may refer to precise values or approximate values and include equivalents, and may refer to average, median, representative, majority, etc. in some embodiments. The word "constituted by" refers to "comprising", "consisting essentially of", or "consisting of" in some embodiments. In this disclosure, any defined meanings do not necessarily exclude ordinary and customary meanings in some embodiments.

In the present disclosure where conditions and/or structures are not specified, the skilled artisan in the art can readily provide such conditions and/or structures, in view of the present disclosure, as a matter of routine experimentation.

In some embodiments, a dielectric film (which is a continuous layer) can be formed on a wafer by plasma-enhanced CVD, thermal CVD, cyclic CVD, plasma-enhanced ALD, thermal ALD, radical-enhanced ALD, or any other thin film deposition methods. Typically, the thickness of the dielectric film is in a range of about 5 nm to about 500 μm.

The embodiments will be explained with respect to preferred embodiments. However, the present invention is not limited to the preferred embodiments.

An embodiment provides an anti-slip end-effector for transporting a workpiece, configured to be attached to a robotic arm and comprising: (i) a workpiece-supporting area for placing a workpiece thereon for transportation, said workpiece having a backside having a glossy finish; and (ii) at least one anti-slip protrusion disposed in the workpiece-supporting area for contacting and supporting the backside of the workpiece, said anti-slip protrusion having a top face having a static friction coefficient of 1.0 or more (including 1.1, 1.2, 1.3, 1.4, 1.5, 1.6, 1.7, 1.8, and values between any of the foregoing numbers) as measured against the backside of the workpiece, and having a surface roughness of less than 0.4 μm (including 0.3 μm, 0.2 μm, 0.1 μm, 0.05 μm, 0.01 μm, 0.001 μm, and values between any of the foregoing numbers). In some embodiments, the top face of the at least one anti-slip protrusion has a surface roughness of less than about 0.05 μm. In some embodiments, the top face of the at least one anti-slip protrusion has a static friction coefficient of 1.2 or more against the backside of the workpiece. It is surprising that when the surface roughness is high, the static friction coefficient does not become as high as 1.0 or more, since in general, a rough surface is less slippery than a smooth surface. The workpiece-supporting area is defined as an area on a top surface of the end effector, immediately above which a workpiece is positioned while the workpiece is being carried by the end effector, and within which the at least one anti-slip protrusion is disposed.

The static friction coefficient ($\mu_s$) is a dimensionless scalar value which describes the ratio of the force of friction between two bodies and the force pressing them together at rest relative to each other. The static friction coefficient is an empirical measurement, i.e., it is measured experimentally, and cannot be found through calculations. Rougher surfaces tend to have higher effective values. The static friction coefficient depends on the pair of surfaces in contact. Most dry materials in combination have friction coefficient values between 0.3 and 0.6, and the static friction coefficient of $Al_2O_3$ against a Si surface is 0.7 to 0.8. The static friction coefficient of 1.0 or more means that the force required to slide an object along the surface is greater than the normal force of the surface on the object. The static friction coefficient for any two materials depends on system variables like temperature, atmosphere, as well as on geometric properties of the interface between the materials.

Figure 8:
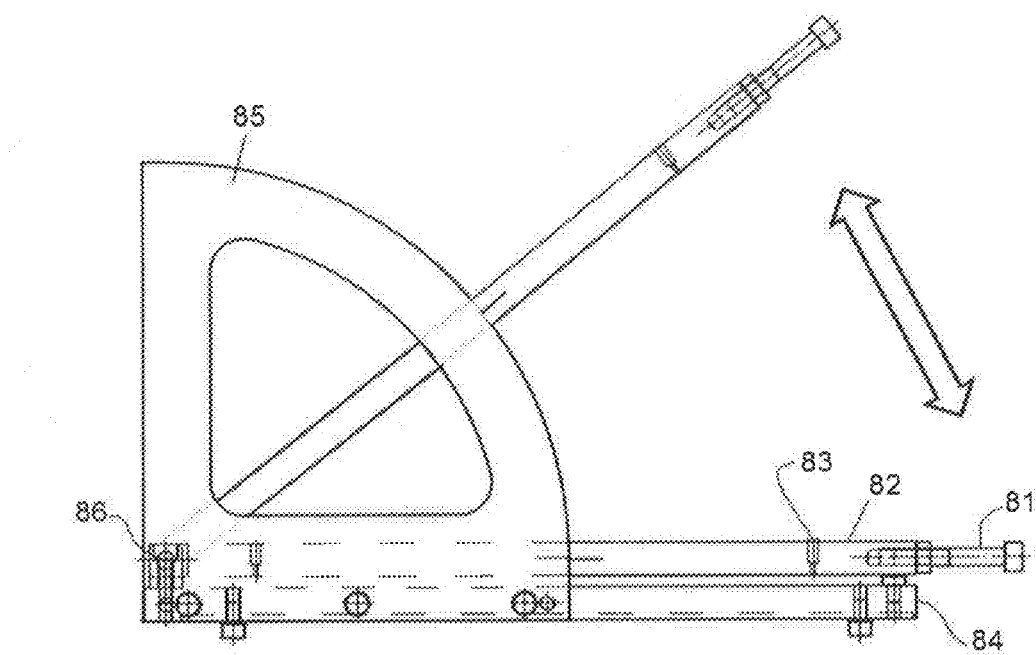
FIG. 8 is a schematic side view (showing partial cross sections) of a static friction coefficient measuring device usable in some embodiments of the present invention.
Figures 9A, 9B, 9C:
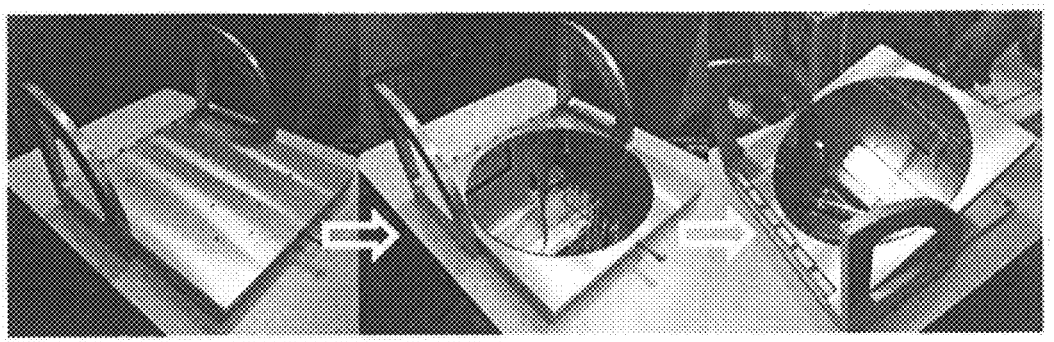
FIGS. 9a, 9b, and 9c are photographs showing measuring steps of static friction coefficient, using the static friction coefficient measuring device illustrated in FIG. 8.

In some embodiments, the static friction coefficient is determined by measuring an angle θ at which a plate having a glossy finish starts sliding against a pin or pins in a clean room at a temperature of about 22° C. and a humidity of about 40%, wherein the static friction coefficient is tan θ. The glossy finish is a mirror-like finish having a surface roughness of e.g., 4 nm or less, typically about 1 nm or less (typically the workpiece is a semiconductor wafer). FIG. 8 is a schematic side view (showing partial cross sections) of a static friction coefficient measuring device usable in some embodiments of the present invention. FIGS. 9a, 9b, and 9c are photographs showing measuring steps of static friction coefficient, using the static friction coefficient measuring device illustrated in FIG. 8. The static friction coefficient measuring device comprises a wafer stage 82 on which a wafer is placed, a lifting handle 81 attached to a distal end of the wafer stage 82, a base 84 on which the wafer stage 82 is placed, and left and right arcs 85 provided with an angle gauge. The wafer stage 82 has holes to which pins 83 are inserted. A proximal end 86 of the wafer stage 82 pivots on the base 84 so that the angle of the wafer stage 82 relative to the base can be changed and can be measured using the angle gauge of the arcs. First, as shown in FIG. 9a, pins are inserted into the holes of the wafer stage and are fixed to the wafer stage. A wafer is then placed on the wafer stage with the pins as illustrated in FIG. 9b. Next, the wafer stage is lifted up slowly using the lifting handle as illustrated in FIG. 9c. The angle θ on the arc is checked when the wafer starts sliding. The static friction coefficient is determined as tan θ. The above measurement is conducted in a clean room at a temperature of about 22° C. and a humidity of about 40%, which may be different from the environment of actual processing in the reaction chamber. However, the environment of actual processing in the reaction chamber is under vacuum and low humidity, and the superiority of the anti-slip end effector with the static friction coefficient can be maintained.

Typically, the end effector is made of $Al_2O_3$ (or other ceramics such as silicon carbide) and when protrusions are made of $Al_2O_3$, the static friction coefficient against a Si surface is 0.7 to 0.8. The static friction coefficient of 0.7-0.8 is not sufficient to transfer a wafer at a high speed, thereby lowering throughput.

In some embodiments, the top face of the at least one anti-slip protrusion is constituted by a convex surface. Preferably, the convex surface has substantially a spherical curvature. Further, in some embodiments, the spherical curvature has a radius of more than 0.5 mm but less than 100 mm, including 1.0 mm, 2.5 mm, 5 mm, 10 mm, 15 mm, 20 mm, 40 mm, 60 mm, and values between any of the foregoing numbers. In an embodiment, the spherical curvature is 10 mm or more. It is surprising that a certain spherical curvature increases the static friction coefficient by a pretreatment (which will be described later), because according to Amontons' laws, the friction force is independent of the area of the surfaces in contact, and the friction force is proportional to the applied load. That is, even if the higher spherical curvature has a larger area of contact, the total friction force should be the same because the friction force per area is proportionally reduced. The state of microscopic contact of a spherical surface against a flat surface may be different depending on the spherical curvature and may affect the static friction coefficient. Incidentally, when anti-slip protrusions have flat tops, the flat tops stochastically cannot entirely be in contact with a backside of a wafer, but are only partially and unevenly in contact with the backside (e.g., contact only by edges of the anti-slip protrusions), and thus, it is difficult to uniformly control the static friction coefficient, creating variations of the static friction coefficient between the anti-slip protrusions and also between the end effectors.

In some embodiments, the at least one anti-slip protrusion consists of multiple anti-slip protrusions. As described above, according to Amontons' laws, the number of anti-slip protrusions does not affect the static friction coefficient. However, the number of anti-slip protrusions may be 1 to 20, preferably 3 to 12 in some embodiments. In some embodiments, the anti-slip protrusions are disposed so that a load on each anti-slip protrusion is substantially identical.

In some embodiments, the top face of the at least one anti-slip protrusion is made of engineering plastics. Engineering plastics are a group of plastic materials that have better mechanical and/or thermal properties than the more widely used commodity plastics (such as polystyrene, PVC, polypropylene and polyethylene). The term refers to thermoplastic materials rather than thermosetting materials. Examples of engineering plastics include acrylonitrile butadiene styrene (ABS), polycarbonates, and polyamidesns (nylons). In some embodiments, the top face of the at least one anti-slip protrusion is made of polybenzimidazole or aromatic polyimide. Preferably, the material has a hardness which is slightly lower than that of a Si wafer, so that when the material has a surface roughness of 0.4 μm or less, a particular area of the top face of the anti-slip protrusion which is actually in contact with the wafer may become smooth by the pretreatment, i.e., microscopic irregularities of the top surface may partially be reduced, thereby locally reducing a surface roughness and increasing an actual area of contact. However, the reduction of microscopic irregularities may happen only on the actual area of contact and does not substantially affect the static friction coefficient of the entire top surface. Thus, the surface roughness of the top surface as a whole can substantially be maintained. However, the localized reduction of microscopic irregularities can increase the static friction coefficient to an effective degree which is 1.0 or higher. It is surprising that although the pretreatment increases the static friction coefficient of the top surface, the static friction coefficient reaches a plateau and becomes stable even if the pretreatment is repeated, and when the surface roughness of the same material is higher than 0.4 μm (e.g., 1.2 μm), the static friction coefficient does not increase even if the pretreatment is conducted.

In some embodiments, the top face of the at least one anti-slip protrusion is the only area which contacts the backside of the workpiece when the workpiece is placed on the workpiece-supporting area. In these embodiments, in the workpiece-supporting area of the end effector, there is no structure other than the anti-slip protrusion, which is in contact with the backside of the workpiece, and also, there is no structure to forcefully clamp the workpiece.

In some embodiments, the at least one anti-slip protrusion is constituted by a pin having threads fixed in the workpiece-supporting area by screw fastening. Alternatively, the pin can be fastened by press-fitting.

In some embodiments, the end effector further comprises at least one front protrusion disposed at a distal end of the workpiece-supporting area for engaging an edge of the workpiece to restrict movement of the workpiece placed on the workpiece-supporting area beyond the front protrusion.

In some embodiments, the backside of the workpiece is constituted by Si, $SiO_2$, SiN, SiC, or gallium arsenide (GaAs). Typically, the workpiece is a Si wafer, and the backside thereof is constituted by silicon; however, the backside of the wafer can be coated with a film such as that made of $SiO_2$, SiN, SiC, or gallium arsenide (GaAs).

Another embodiment provides a robotic arm for transporting a workpiece, comprising at least one arm which is movable vertically, front and rear, and laterally, and any of the anti-slip end effectors disclosed herein attached to a distal end of each arm.

Still another embodiment provides a method of manufacturing any of the anti-slip end-effectors disclosed herein, comprising: (a) providing at least one pin as an anti-slip protrusion, which has a surface roughness of less than 0.4 μm; (b) sliding a backside of a dummy workpiece constituted by Si, $SiO_2$, SiN, SiC, or gallium arsenide (GaAs) against a top face of the at least one pin (e.g., at least twenty times, including 30 times, 40 times, 50 times, 60 times, and values between any of the foregoing numbers) as a pretreatment to increase a static friction coefficient between the top face of the at least one pin and the backside of the dummy workpiece until the top face exhibits a static friction coefficient of 1.0 or more as measured against the backside of the dummy workpiece; and (c) installing the pretreated pin in a workpiece-supporting area of an end effector. The above pretreatment can effectively increase the static friction coefficient of the anti-slip protrusion. The static friction coefficient is increased to a certain level and reaches a plateau. Once the static friction coefficient is increased, it can be maintained during the actual processing of the workpiece. The number of times the dummy workpiece slides against the top face of the at least one pin before installing the pretreated pin in the workpiece-supporting area of the end effector depends on the weight of the workpiece, the surface roughness of the backside of the workpiece, etc.

Alternatively, the pretreatment can be accomplished by polishing or rubbing the top face of the at least one pin with any suitable flat hard glossy surface having a greater hardness than the top face and a smaller surface roughness than the top face, using any suitable mechanical process, in place of step (b) above.

In some embodiments, the dummy wafer has a weight of 128 g, and thus, if four pins are used and the wafer starts slipping at a frictional angle of 45°, the top faces of the pins are considered to be rubbed by the backside of the wafer with a load of 22.6 g per pin (128/4/√2=22.6). Alternatively, the top faces of the pins can be mechanically rubbed by a material equivalent to the above with force equivalent to the above.

Yet another embodiment provides a method of transporting a workpiece using any of the anti-slip end-effectors disclosed herein, comprising: (I) providing a robot arm to which the end effector is attached; (II) placing a workpiece on the workpiece-supporting area of the end effector; and (III) transporting the workpiece from one chamber to another chamber using the robot arm while keeping the workpiece on the workpiece-supporting area of the end effector.

In some embodiments, the backside of the workpiece has a mirror-like finish, and the backside of the workpiece may have a surface roughness of 4 nm or less (typically about 1 nm or less). When the backside of the workpiece has a low surface roughness which is lower than that of the anti-slip protrusion of the end effector, the anti-slip function of the end effector can effectively be realized.

The present invention will be explained below with reference to the drawings, which are used merely by way of example and are not intended to limit the present invention.

Figure 3:
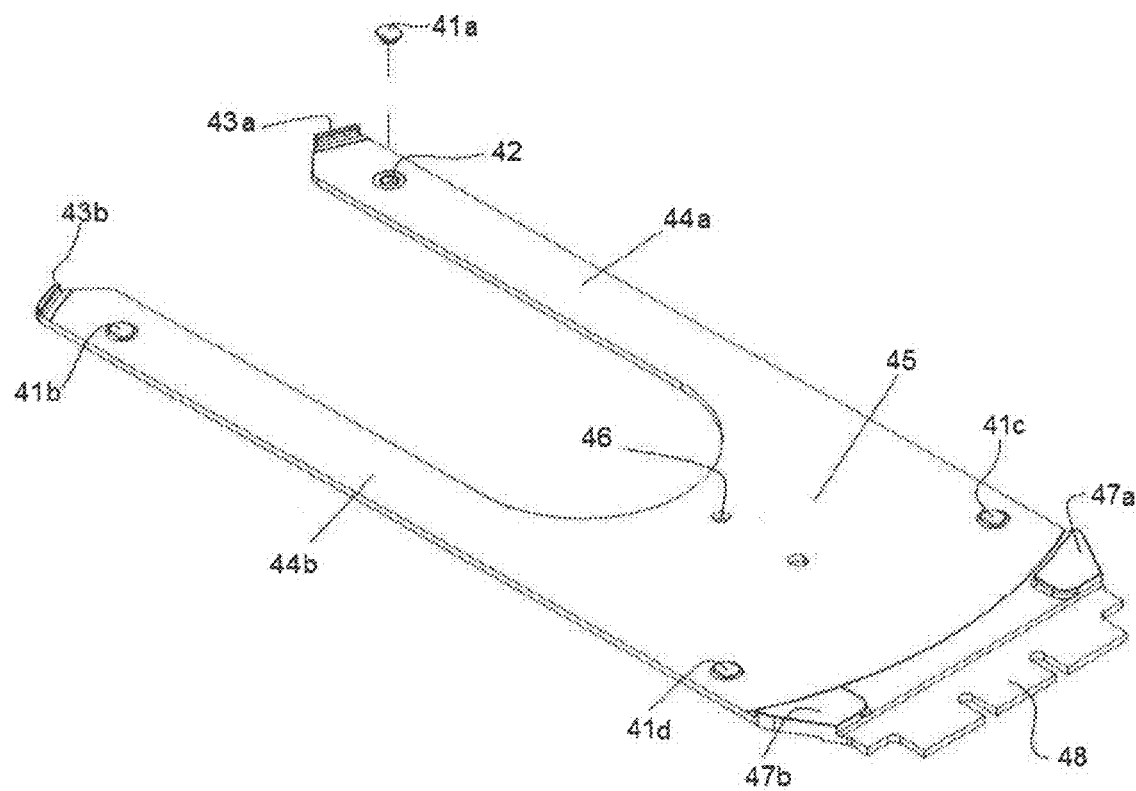
FIG. 3 is a schematic perspective view of an end effector according to an embodiment of the present invention.

FIG. 3 is a schematic perspective view of an end effector according to an embodiment of the present invention. The end effector is constituted by a paddle 45, a left blade 44b and a right blade 44a extending from the paddle 45, and a joint section 48 configured to be attached to a robotic arm. The paddle 45 also has holes 46 for securing the end effector to the robotic arm. The distal ends of blade 44b, 44a are provided with front protrusions 43b, 43a, respectively, for inhibiting a wafer from dropping from the end effector in the event that the wafer slips. The front protrusions also can be used for positioning the wafer on the end effector. The proximal end of the paddle 45 also has rear protrusions 47b, 47a for restricting displacement of the wafer. Near the distal end, the right blade 44a has a hole 42 with threads, to which a pin (anti-slip protrusion) 41a is inserted and fastened. The left blade 44b has the same structure where a pin 41b is fastened near the distal end. The paddle 45 also has pins 41c, 41d near the proximal end close to the respective side peripheries. The workpiece-supporting area is defined by the front protrusions 43b, 43a, and the rear protrusions 41c, 41d. In some embodiments, the end effector including the workpiece-supporting area is constituted by $Al_2O_3$ and has a length of about 300 mm, for example. The height of the front protrusions 43a, 43b from the top surface of the end effector is about 2.3 mm, for example, the height of the anti-slip protrusions 41a, 41b, 41c, 41d from the top surface is about 1.4 mm, for example, and the height of the rear protrusions 47a, 47b from the top surface is about 2.5 mm, for example. The above variable numbers can be modified by ±50% in some embodiments.

Figure 4:
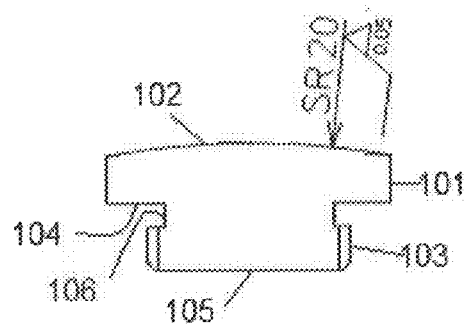
FIG. 4 is a schematic cross sectional view of a pin (anti-slip protrusion) according to an embodiment of the present invention.

FIG. 4 is a schematic cross sectional view of a pin (anti-slip protrusion) according to an embodiment of the present invention. The pin is constituted by a head part having a top face 102, a side periphery 101, and an underside 104; a neck part 106, and a screw part having threads 103 and a bottom face 105. The top face 102 has a spherical radius (SR) of 20 mm and a surface roughness (Ra) of 0.05 μm, for example. The width of the head part may be in a range of 3 mm to 10 mm (preferably, 5 mm to 7 mm). The thickness of the head part may be in a range of 1.0 mm to 3.0 mm (preferably, about 2.0 mm). The plan view of the head part may be shaped in a circle or truncated circle (as illustrated in FIG. 3) or in any other shape. Since only the apex area of the top face is used, the width of the head part need not be wide and can be truncated. The thickness of the head part need not correspond to the height of the pin from the top surface of the end effector, since the top surface of the end effector has a recessed area around the hole 42, in which the head part is fitted as illustrated in FIG. 3, so that the head part can be thick according to mechanical strength but can be of low height relative to the top surface of the end effector. The underside 104 tightly contacts a recessed surface around the hole 42 when the pin is fastened by the screw part with the threads 103. The above variable numbers can be modified by ±50% in some embodiments.

Figure 2:
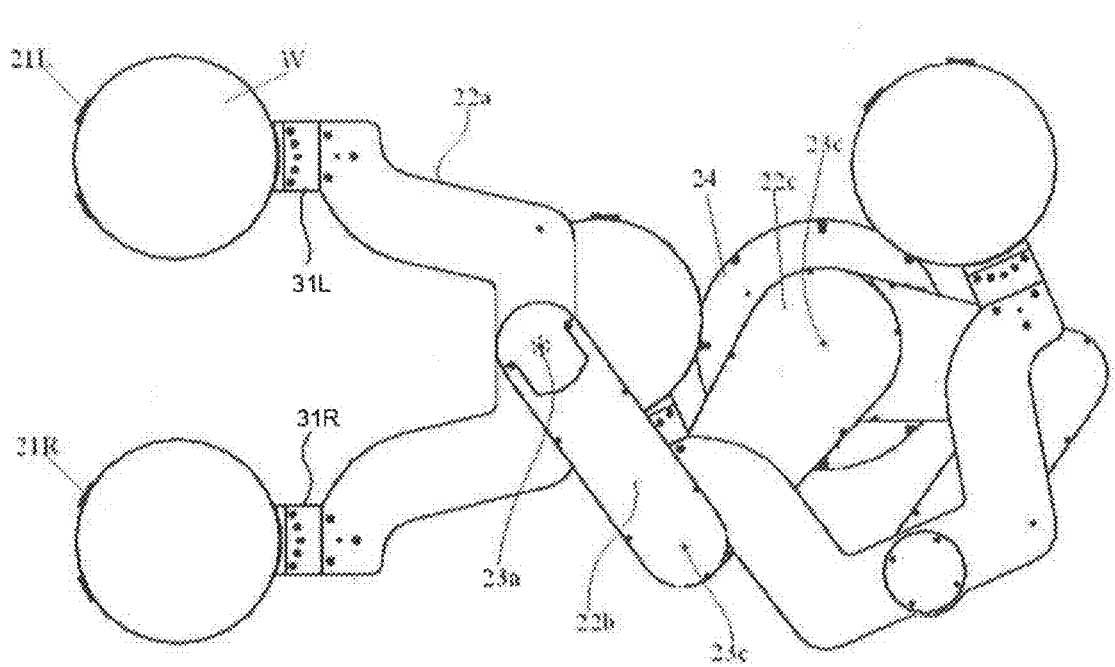
FIG. 2 is a schematic plan view of a dual arm wafer-handling robot usable in some embodiments of the present invention.

The end effector is configured to be attached to a robotic arm as illustrated in FIG. 2. FIG. 2 is a schematic plan view of a dual arm wafer-handling robot usable in some embodiments of the present invention. In some embodiments, this type of dual-arm wafer-handling robot can preferably be used in an apparatus illustrated in FIG. 1. However, when the number of process chambers is four or less, for example, a single-arm wafer-handling robot can be used (which is typically a multi axis robot). As shown in FIG. 2, the robotic arm is comprised of a fork-shaped portion 22a, a middle portion 22b, and a bottom portion 22c. The fork-shaped portion 22a is equipped with end-effectors 21R and 21L for supporting wafers thereon. The fork-shaped portion 22a and the middle portion 22b are connected via a joint 23a, the middle portion 22b and the bottom portion 22c are connected via a joint 23b, and the bottom portion is connected to an actuator 24 via a joint 23c. In some embodiments, any suitable wafer-handling robot can be used, such as those disclosed in U.S. Pat. No. 5,855,681, the disclosure of which is herein incorporated by reference in its entirety. In some embodiments, the robotic arm has a three-prong portion for conveying three wafers at once, instead of a fork-shaped portion. The distal ends of the fork-shaped portion 22a are provided with joint portions 31L, 31R, to which the joint section 48 of the end effector is attached. This robot arm is capable of controlling lateral motion of the end effector along an X axis, front and back motion thereof along a Y axis, vertical motion thereof along a Z axis, and rotational motion thereof about the Z axis.

FIG. 1 is a schematic plan view of a wafer-processing apparatus with dual chamber modules using the robot arm illustrated in FIG. 2 in some embodiments of the present invention. The wafer-processing apparatus combines four process modules 1a, 1b, 1c, 1d (each provided with two reactors 2), a wafer in/out chamber 5, and a wafer-handling chamber 4 provided with back end robots 3, desirably in conjunction with controls programmed to conduct the sequences described below, which can be used in some embodiments of the present invention. In this embodiment, the wafer-processing apparatus comprises: (i) eight reactors 2 (each having a right chamber (R) and a left chamber (L)) for processing wafers on the same plane, constituting four discrete process modules (units) 1a, 1b, 1c, 1d, each module 1 having two reactors 2 arranged side by side with their fronts aligned in a line; (ii) a wafer-handling chamber 4 including two back end robots 3 (wafer-handling robots), each having at least two end-effectors accessible to the two reactors of each unit simultaneously, said wafer-handling chamber 4 having a polygonal shape having four sides corresponding to and being attached to the four process modules 1a, 1b, 1c, 1d, respectively, and one additional side for a wafer in/out chamber (load lock chamber) 5, all the sides being disposed on the same plane; and (iii) a wafer in/out chamber 5 for loading or unloading two wafers simultaneously, said wafer in/out chamber 5 being attached to the one additional side of the wafer-handling chamber, wherein each back end robot 3 is accessible to the wafer in/out chamber 5. The interior of each reactor 2 and the interior of the wafer in/out chamber 5 can be isolated from the interior of the wafer-handling chamber 4 by a gate valve 9. In some embodiments, a controller (not shown) stores software programmed to execute sequences of wafer transfer, for example. The controller also checks the status of each process chamber, positions wafers in each process chamber using sensing systems, controls a gas box and electric box for each module, controls a front end robot (FERB) 7 in an equipment front end module (EFEM) 6 based on a distribution status of wafers stored in loading ports (LP) 8 and a load lock chamber (LLC) 5, controls back end robots (BERB) 3, and controls gate valves (GV) 9 as shown in FIG. 1. A skilled artisan will appreciate that the apparatus includes one or more controller(s) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

In some embodiments, the apparatus has any number of process chambers greater than one (e.g., 2, 3, 4, 5, 6, or 7). In FIG. 1, the apparatus has eight process chambers, but it can have ten or more. Typically, the apparatus has one or more dual chamber modules. In some embodiments, the reactors of the modules can be any suitable reactors for processing or treating wafers, including CVD reactors such as plasma-enhanced CVD reactors and thermal CVD reactors, ALD reactors such as plasma-enhanced ALD reactors and thermal ALD reactors, etching reactors, and UV-curing reactors. Typically, the process chambers are plasma reactors for depositing a thin film or layer on a wafer. In some embodiments, all the modules are of the same type having identical capability for treating wafers so that the unloading/loading can sequentially and regularly be timed, thereby increasing productivity or throughput. In some embodiments, the modules have different capacities (e.g., different treatments) but their handling times are substantially identical.

The apparatus disclosed in U.S. Patent Application Publication No. 2012/0305196 can be used in some embodiments, the disclosure of which is herein incorporated by reference in its entirety. In some embodiments, any suitable wafer positioning system such as those disclosed in U.S. Patent Application Publication No. 2012/0325148, U.S. Pat. No. 7,963,736, and U.S. Pat. No. 8,041,450 can be employed, each disclosure of which is herein incorporated by reference in its entirety.

Example 1

The following pins having a cross section illustrated in FIG. 4 (except that the surface roughness varied and the thickness of the head part was 1.5 mm) were prepared:

(1) Pins made of $Al_2O_3$ having a top face with a surface roughness (Ra) of 0.4 μm and a spherical radium (SR) of 10 mm.

(2) Pins made of polybenzimidazole (PBI) having a top face with an Ra of 0.05 μm and a SR of 10 mm.

(3) Pins made of PBI having a top face with an Ra of 0.4 μm and a SR of 10 mm.

(4) Pins made of PBI (with shot blasting treatment) having a top face with an Ra of 1.2 μm and a SR of 10 mm.

Figure 5:
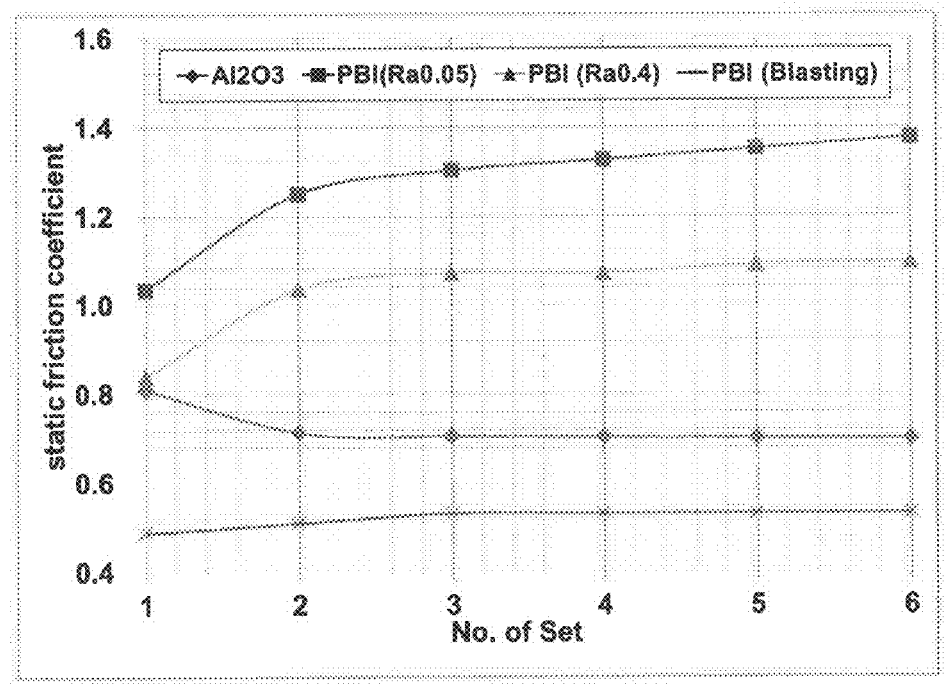
FIG. 5 is a graph showing changes of static friction coefficient of pins made of $Al_2O_3$ having a surface roughness (Ra) of 0.4 μm, polybenzimidazole (PBI) having an Ra of 0.05 μm, PBI having an Ra of 0.4 μm, and PBI (blasting) having an Ra of 1.2 μm (all of them having a spherical curvature of 10 mm) in relation to the number of times a Si wafer slid against the pins (one set refers to 10 measurements).

Four pins of each type were installed on a wafer stage of a static friction coefficient measuring device illustrated in FIG. 8. A 300-mm Si wafer was placed on the wafer stage with the pins, and by lifting the wafer stage, a sliding angle θ at which the wafer started sliding was measured as illustrated in FIG. 9. The static friction coefficient was calculated as tan θ. The above static friction coefficient measuring steps were continuously repeated. FIG. 5 is a graph showing changes of static friction coefficient of pins (1) ($Al_2O_3$), pins (2) (PBI (Ra 0.05)), pins (3) (PBI (Ra 0.4), and pins (4) (PBI (Blasting)) in relation to the number of times the wafer slid against the pins (one set refers to 10 measurements and the obtained values from $1^{st}$ measurement to $10^{th}$ measurement in the one set were averaged).

As shown in FIG. 5, even though the pins of $Al_2O_3$ and the pins of PBI (Ra 0.4) had the same surface roughness (Ra=0.4 μm), and both had substantially the same static friction coefficient (about 0.8) at the first set (sliding 10 times), the static friction coefficient of the pins of PBI (Ra 0.4) increased and exceeded 1.0 at the second and subsequent sets whereas the static friction coefficient of the pins of $Al_2O_3$ decreased to about 0.7 at the second set. Further, even though the pins of PBI (Blasting) and the pins of PBI (Ra 0.4) were made of the same material, the static friction coefficient of the pins of PBI (Ra 0.4) increased and exceeded 1.0 at the second and subsequent sets whereas the static friction coefficient of the pins of PBI (Blasting) was almost unchanged at the second and subsequent sets. Further, the static friction coefficient of the pins of PBI (Ra 0.05) was slightly above 1.0 at the first set, and increased to about 1.25 at the second set and to about 1.4 at the sixth set. The static friction coefficients of the pins of PBI (Ra 0.4) and PBI (Ra 0.05) became stable after the second to sixth sets.

When the static friction coefficient of the pins is about 1.0 (but not less than 1.0) against a semiconductor wafer, a robot arm can transport the wafer at a high speed so as to increase throughput to e.g., 420 wafers per hour using the apparatus illustrated in FIG. 1. When the static friction coefficient of the pins is about 1.2 against a semiconductor wafer, a robot arm can transport the wafer at a higher speed so as to increase throughput to e.g., 500 wafers per hour using the apparatus illustrated in FIG. 1. Further, when the static friction coefficient of the pins is about 1.0 (but not less than 1.0) against a semiconductor wafer, and a robot arm transports the wafer at a standard speed (throughput is e.g., 350 to 400 wafers per hour using the apparatus illustrated in FIG. 1), process stability can be increased and transfer errors can be reduced.

Example 2

The following pins having a cross section illustrated in FIG. 4 (except that the spherical radius varied and the thickness of the head part was 1.5 mm) were prepared:

(5) Pins made of PBI having a top face with an Ra of 0.05 μm and a spherical radius (SR) of 2.5 mm.

(6) Pins made of PBI having a top face with an Ra of 0.05 μm and a SR of 20 mm.

Figure 6:
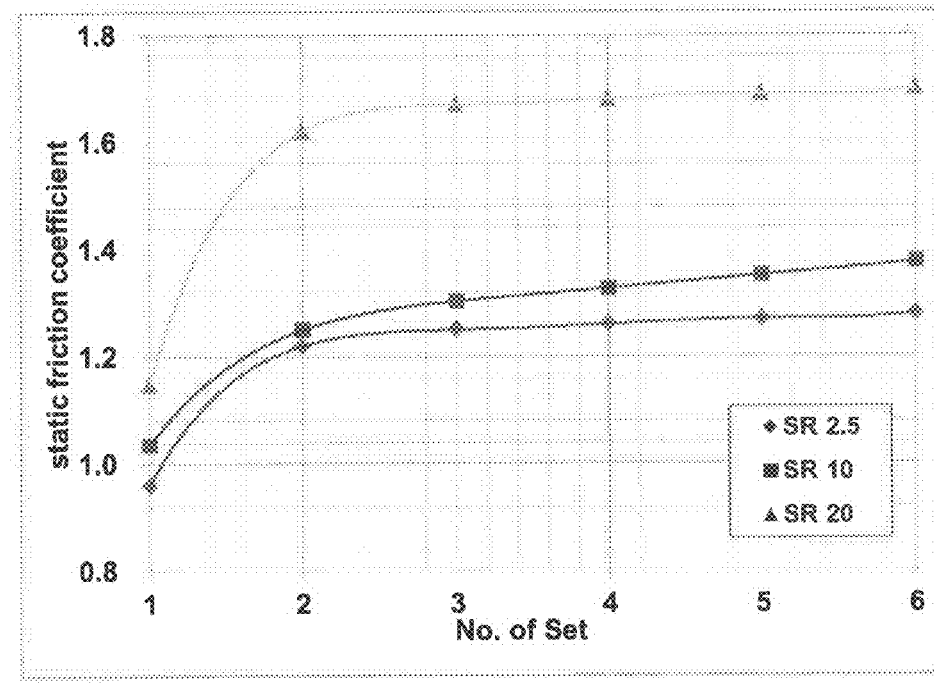
FIG. 6 is a graph showing changes of static friction coefficient of pins made of PBI having a spherical radius (SR) of 2.5 mm, 10 mm, and 20 mm (all of them having a Ra of 0.05 μm) in relation to the number of times a Si wafer slid against the pins (one set refers to 10 measurements).

Four pins of each type were installed on the wafer stage of the static friction coefficient measuring device illustrated in FIG. 8. A 300-mm Si wafer was placed on the wafer stage with the pins, and by lifting the wafer stage, a sliding angle θ at which the wafer started sliding was measured as illustrated in FIG. 9. The static friction coefficient was calculated as tan θ. The above static friction coefficient measuring steps were continuously repeated. FIG. 6 is a graph showing changes of static friction coefficient of pins (5) (SR 2.5), pins (6) (SR 20), and pins (2) (SR 10) (which were used in Example 1) in relation to the number of times the wafer slid against the pins (one set refers to 10 measurements and the obtained values from $1^{st}$ measurement to $10^{th}$ measurement in the one set were averaged).

As shown in FIG. 6, even though the pins of SR 2.5, SR 10, and SR 20 were made of the same material (PBI), the static friction coefficient of the pins of SR 2.5 increased slightly less than that of the pins of SR 10 although the static friction coefficient of the pins of SR 2.5 exceeded 1.0 at the second and subsequent sets, whereas the static friction coefficient of the pins of SR 20 increased significantly more than that of the pins of SR 10 and exceeded 1.6 at the second set and reached 1.7 at the sixth set.

A transportation test was conducted using the apparatus illustrated in FIG. 1 wherein four pins (6) were installed in each end effector, and no changes were detected regarding anti-slipping properties of the end effectors even after transporting more than 40,000 wafers.

Example 3

The following pins having a cross section illustrated in FIG. 4 (except that the spherical radius was 10 mm, the thickness of the head part was 1.5 mm, and a surface roughness was 0.4 μm) were prepared:

(7) Pins made of $Al_2O_3$.
(8) Pins made of PBI (CELAZOLE®).
(9) Pins made of quartz.

Figure 7:
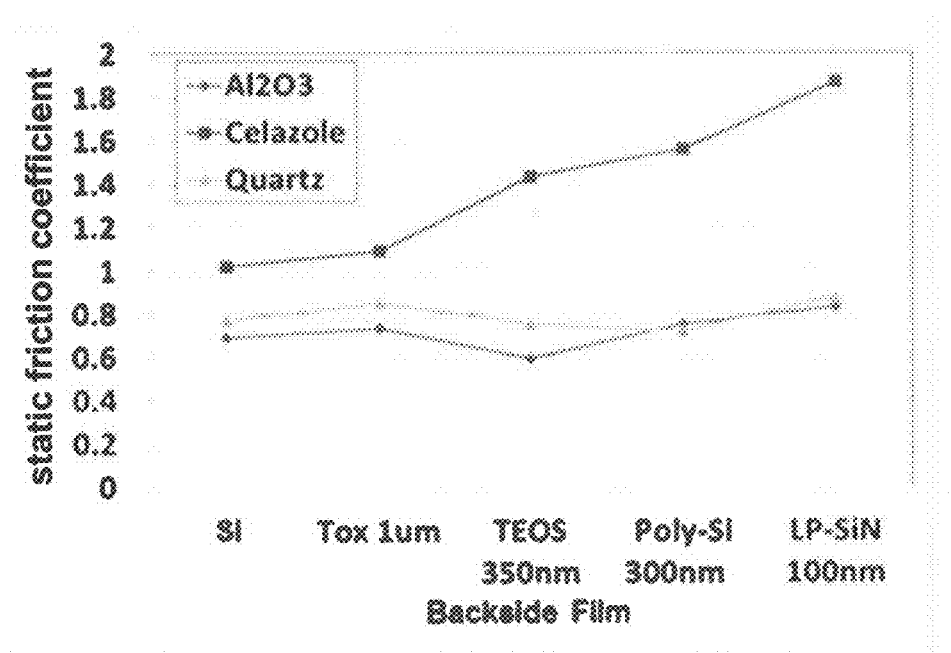
FIG. 7 is a graph showing changes of static friction coefficient of pins made of $Al_2O_3$, CELAZOLE® (PBI), and quartz (all of them having an Ra of 0.4) in relation to the type of backside film of a wafer sliding against the pins.

Four pins of each type were installed on the wafer stage of the static friction coefficient measuring device illustrated in FIG. 8. A 300-mm Si wafer was placed on the wafer stage with the pins, and by lifting the wafer stage, a sliding angle θ at which the wafer started sliding was measured as illustrated in FIG. 9. The static friction coefficient was calculated as tan θ. The above static friction coefficient measuring steps were continuously repeated 60 times. The same steps were conducted using a 300-mm Si wafer having a different film formed thereon. FIG. 7 is a graph showing changes of static friction coefficient of pins (7) ($Al_2O_3$), pins (8) (CELAZOLE), and pins (9) (quartz) in relation to the type of backside film of the wafer sliding against the pins, wherein "Si" represents no film, "Tox 1 um" represents a thermal oxide film with a thickness of 1 μm, "TEOS 350 nm" represents a silicon oxide film with a thickness of 350 nm, "Poly-Si 300 nm" represents a polysilicon film with a thickness of 300 nm, and "LP-SiN 100 nm" represents a silicon nitride film with a thickness of 100 nm ("LP" denotes deposition by low pressure thermal CVD).

As shown in FIG. 7, regardless of the type of film, the static friction coefficient of pins (7) and pins (9) did not exceed 1.0, whereas the static friction coefficient of pins (8) exceeded 1.0. Further, the static friction coefficient of pins (8) changed depending on the type of film, and when the pretreatment was conducted against the silicon nitride film, the static friction coefficient of the pins was the highest (about 1.9), followed by the polysilicon film (about 1.6), the silicon oxide film (about 1.4), the thermal oxide film about 1.5), and no film (about 1.0).

Reference Example

Pins (7) (made of $Al_2O_3$) were installed on the wafer stage of the static friction coefficient measuring device illustrated in FIG. 8 in a manner described below:

(A) Three pins (one in a front middle section, two near a rear periphery).

(B) Eight pins (two near a front periphery, two near a rear periphery, four in a middle section).

(C) Three pins (two near a front periphery).

(D) Twelve pins (four near a front periphery, four near a rear periphery, four in a middle section).

Figure 10:
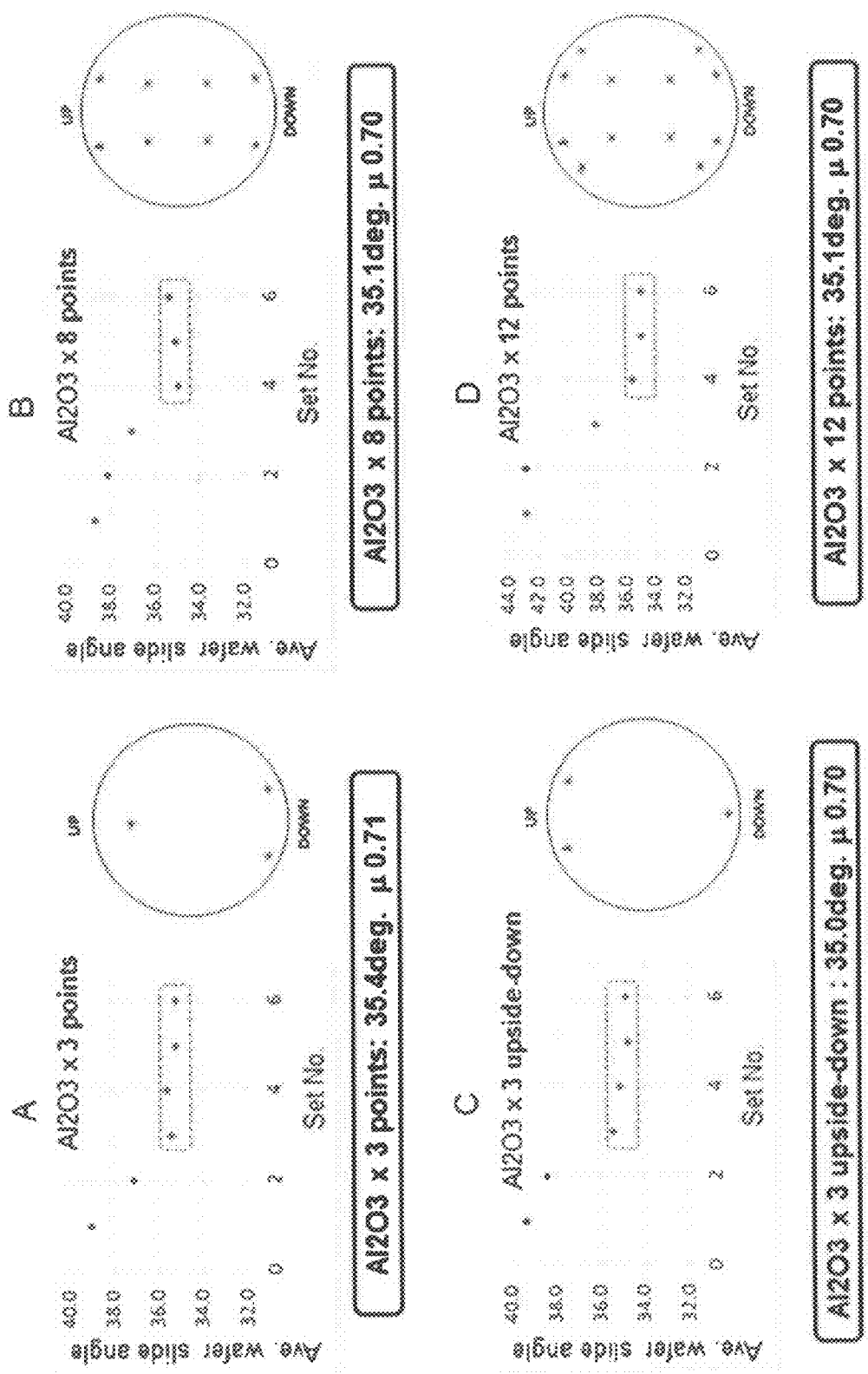
FIG. 10 consists of A, B, C, and D which show the relationship between the number and positions of pins and the static friction coefficient (represented by average wafer slide angle).

A 300-mm Si wafer was placed on the wafer stage with the pins, and by lifting the wafer stage, a sliding angle θ at which the wafer started sliding was measured as illustrated in FIG. 9. The above sliding angle measuring steps were continuously repeated. FIG. 10 consists of A, B, C, and D which show the relationship between the number and positions of pins and the static friction coefficient (represented by average wafer slide angle), each graph showing changes of average wafer slide angle of the pins (A), (B), (C), and (D) in relation to the number of times the wafer slid against the pins (one set refers to 10 measurements and the obtained values from $1^{st}$ measurement to $10^{th}$ measurement in the one set were averaged).

As shown in FIG. 10, regardless of the number of pins and the locations thereof, the static friction coefficient of the pins was about 0.70 after being stabilized at the fourth to sixth sets. It was confirmed that the number and locations of pins provide substantially no influence on the static friction coefficient of the pins against the wafer.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. An anti-slip end-effector for transporting a workpiece, configured to be attached to a robotic arm and comprising:
    a workpiece-supporting area for placing a workpiece thereon for transportation, said workpiece having a backside having a glossy finish; and
    at least one anti-slip protrusion disposed in the workpiece-supporting area for contacting and supporting the backside of the workpiece, said anti-slip protrusion having a top face having a static friction coefficient of 1.0 or more as measured against the backside of the workpiece, and having a surface roughness of less than 0.4 μm,
    wherein the top face of the at least one anti-slip protrusion is constituted by a convex surface having a spherical curvature with a radius of 2.5 mm or more, and is made of polybenzimidazole.

2. The anti-slip end-effector according to claim 1, wherein the top face of the at least one anti-slip protrusion has a surface roughness of less than about 0.05 μm.

3. The anti-slip end-effector according to claim 1, wherein the top face of the at least one anti-slip protrusion has a static friction coefficient of 1.2 or more against the backside of the workpiece.

4. The anti-slip end-effector according to claim 1, wherein the spherical curvature has a radius of 10 mm or more.

5. The anti-slip end-effector according to claim 1, wherein the at least one anti-slip protrusion consists of multiple anti-slip protrusions.

6. The anti-slip end-effector according to claim 1, wherein the top face of the at least one anti-slip protrusion is the only area which contacts the backside of the workpiece when the workpiece is placed on the workpiece-supporting area.

7. The anti-slip end-effector according to claim 1, wherein the at least one anti-slip protrusion is constituted by a pin having threads fixed in the workpiece-supporting area by screw fastening.

8. The anti-slip end-effector according to claim 1, further comprising at least one front protrusion disposed at a distal end of the workpiece-supporting area for engaging an edge of the workpiece to restrict movement of the workpiece placed on the workpiece-supporting area beyond the front protrusion.

9. The anti-slip end-effector according to claim 1, wherein the backside of the workpiece is constituted by Si, $SiO_2$, SiN, SiC, or gallium arsenide (GaAs).

10. The anti-slip end-effector according to claim 1, wherein the workpiece-supporting area is constituted by $Al_2O_3$ or silicon carbide.

11. A robotic arm for transporting a workpiece, comprising at least one arm which is movable vertically, front and rear, and laterally, and the anti-slip end effector of claim 1 attached to a distal end of each arm.

12. A method of manufacturing the anti-slip end-effector of claim 1, comprising:
    providing at least one pin as an anti-slip protrusion, which has a surface roughness of less than 0.4 μm and has a top face made of polybenzimidazole and constituted by a convex surface having a spherical curvature with a radius of 2.5 mm or more;
    sliding a backside of a dummy workpiece constituted by Si, $SiO_2$, SiN, SiC, or gallium arsenide (GaAs) against the top face of the at least one pin to increase a static friction coefficient between the top face of the at least one pin and the backside of the dummy workpiece as a pretreatment until the top face exhibits a desired static friction coefficient of 1.0 or more as measured against the backside of the dummy workpiece; and then installing the pretreated pin in a workpiece-supporting area of an end effector.

13. The method according to claim 12, wherein the dummy workpiece slides against the top face of the at least one pin about twenty to sixty times before installing the pretreated pin in the workpiece-supporting area of the end effector.

\* \* \* \* \*